(12) United States Patent
Inohara

(10) Patent No.: US 8,102,059 B2
(45) Date of Patent: Jan. 24, 2012

(54) INTERCONNECT STRUCTURE FOR HIGH FREQUENCY SIGNAL TRANSMISSIONS

(75) Inventor: Masahiro Inohara, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 267 days.

(21) Appl. No.: 12/402,018

(22) Filed: Mar. 11, 2009

(65) Prior Publication Data

US 2010/0006990 A1 Jan. 14, 2010

Related U.S. Application Data

(60) Provisional application No. 61/036,934, filed on Mar. 15, 2008.

(51) Int. Cl.
*H01L 23/535* (2006.01)

(52) U.S. Cl. ......... 257/775; 257/E23.011; 257/E23.141; 257/E23.168

(58) Field of Classification Search .................. 257/775, 257/E23.011, E23.141, E23.168
See application file for complete search history.

(56) References Cited

U.S. PATENT DOCUMENTS

| | | | |
|---|---|---|---|
| 6,191,029 B1 * | 2/2001 | Hsiao et al. | 438/633 |
| 6,205,570 B1 | 3/2001 | Yamashita | |
| 2008/0073795 A1 * | 3/2008 | Kohl et al. | 257/774 |
| 2008/0308303 A1 * | 12/2008 | Lehmann et al. | 174/255 |

FOREIGN PATENT DOCUMENTS

JP 2000-031288 A 1/2000

* cited by examiner

*Primary Examiner* — Benjamin Sandvik
*Assistant Examiner* — Wensing Kuo
(74) *Attorney, Agent, or Firm* — Banner & Witcoff, Ltd.

(57) ABSTRACT

A higher aspect ratio for upper level metal interconnects is described for use in higher frequency circuits. Because the skin effect reduces the effective cross-sectional area of conductors at higher frequencies, various approaches are described to reduce the effective RC delay in interconnects.

8 Claims, 5 Drawing Sheets

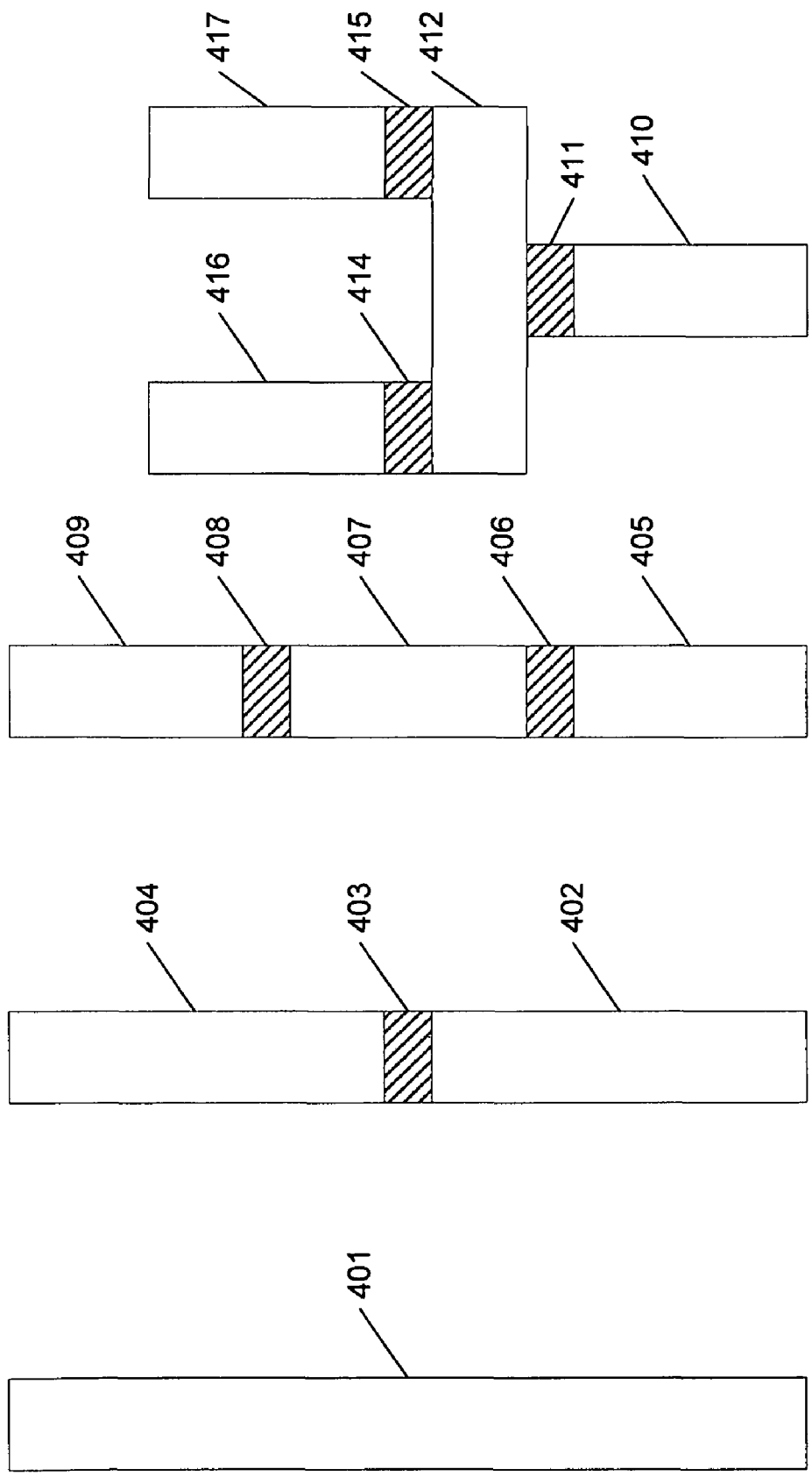

INTERCONNECT STRUCTURE FOR HIGH FREQUENCY SIGNAL TRANSMISSIONS

RELATED APPLICATION

This application claims priority to U.S. Provisional Application Ser. No. 61/036,934, filed Mar. 15, 2008, whose contents are expressly incorporated herein by reference.

TECHNICAL FIELD

Aspects of the invention relate to providing an interconnect structure for high frequency semiconductor devices.

BACKGROUND

Semiconductor devices are used in a variety of fields including communication fields. By using different types of semiconductors (including, but not limited to, indium phosphide and gallium arsenide), devices have been created to for higher frequency applications.

Part of a device is the device's interconnect structure. Conventional devices use larger conductors as the current in a signal increases or as the distance a signal needs to be conveyed increases. Larger conductors can consume significant real estate. Also, because of phenomena (including the skin effect) that occur as frequencies increase, larger conductors alone cannot provide interconnect structures in integrated circuits that also further device miniaturization.

SUMMARY

Aspects of the invention pertain to interconnect structures for use with higher frequency semiconductor devices. In one example, aspect ratios for upper level interconnect lines are increased in comparison to lower level interconnect lines. In another example, multiple line segments are connected by connecting plugs to overcome maximum pitch limits. These and other examples are described herein.

BRIEF DESCRIPTION OF THE DRAWINGS

FIGS. 4A, 4B, 4C, and 4D show various interconnects in accordance with one or more embodiments.

DETAILED DESCRIPTION

One or more aspects of the invention relate to interconnects for use with high frequency semiconductor devices.

It is noted that various connections are set forth between elements in the following description. It is noted that these connections in general, unless specified otherwise, may be direct or indirect and that this specification is not intended to be limiting in this respect.

Figure 1:
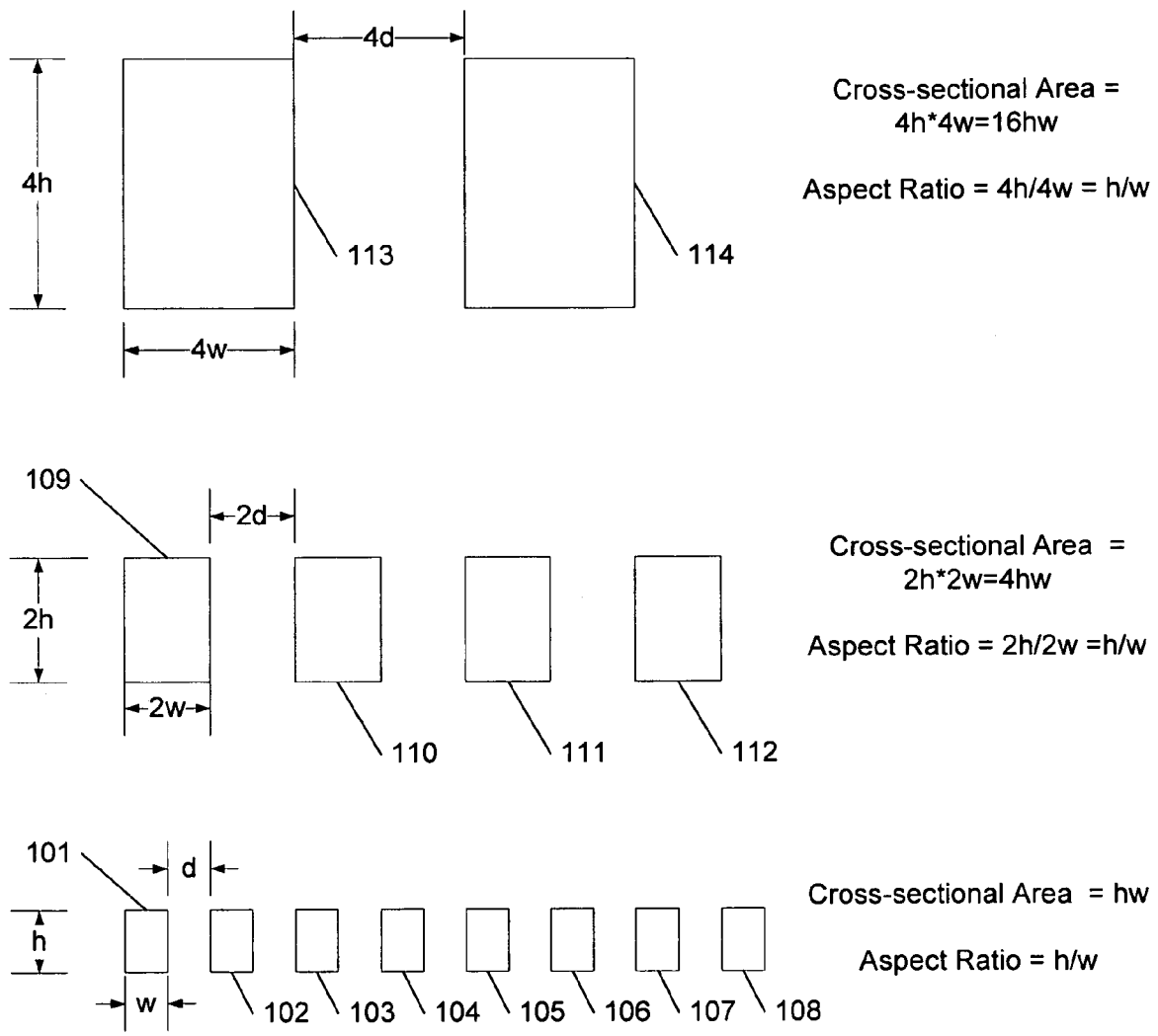
FIG. 1 shows an example of conductors with different cross-sectional areas and the same aspect ratio.

Conventional interconnects are shown in FIG. 1 in an elevation view where lower level interconnects have a small cross-sectional area, midlevel interconnects have larger cross-sectional areas, and top level interconnects have the largest cross-sectional areas. In FIG. 1, interconnects 101-108 are shown as having an aspect ratio of h/w (as shown in FIG. 1, about 1.5:1). Aspect ratios between 1:0 and 2:0 (generally, 1.7:1 to 2.0:1) are common. For reference, the height is designated as "h" and the width is designated as "w." For interconnects 101-108, each is represented as having a cross-sectional area of h*w (or hw). Interconnects 101-108 are separated by a distance "d." For purposes of explanation and comparison, distance d is set to be the same as width w.

Each interconnect 101-108 has an associated resistance and capacitance. Resistance can be calculated by the following equation (1):

$$R = \frac{\ell \cdot \rho}{A} \quad (1)$$

where:
l is the length of the conductor, measured in meters;
A is the cross-sectional area, measured in square meters; and
ρ (Greek: rho) is the electrical resistivity (also called specific electrical resistance) of the material, measured in Ohm·meter. Resistivity is a measure of the material's ability to oppose electric current.

With respect to interconnects 101-108, the resistance is then:

$$R = \frac{\ell \cdot \rho}{A} = \frac{\ell \cdot \rho}{h \cdot w} \quad (2)$$

In short, the resistance R for a given interconnect decreases as the cross-sectional area of the interconnect increases.

Capacitance between the interconnects 101-108 can be determined if the geometry of the interconnects 101-108 and the dielectric properties of the insulator between interconnects 101-108 is known. For instance, assuming interconnects 101-108 are parallel plates, with a height h and a length l separated by a distance d is approximately equal to the following equation:

$$C = \varepsilon_r \varepsilon_0 \frac{A}{d} \quad (3)$$

where
C is the capacitance in farads F;
A is the area of overlap of the two plates measured in square meters (height h being shown in FIG. 1 and length l into the page);
$\varepsilon_r$ is the relative static permittivity (sometimes called the dielectric constant) of the material between the plates, (vacuum=1);
$\varepsilon_0$ is the permittivity of free space where $\varepsilon_0 = 8.854 \times 10^{-12}$ F/m; and
d is the separation between the plates, measured in meters.

Equation (3) is a good approximation if d is small compared to the other dimensions of the plates so the field in the capacitor over most of its area is uniform, and the fringing field around the periphery provides a small contribution.

In this regard, the capacitance between interconnects 101-108 can be approximated as follows:

$$C = \varepsilon_r \varepsilon_0 \frac{A}{d} = \varepsilon_r \varepsilon_0 \frac{h \cdot \ell}{d} \quad (4)$$

In short, the capacitance C between two interconnects of 101-108 increases as the cross-sectional area between the interconnects increases and decreases as the distance between the interconnects increases. Assuming length 1 is constant, then the capacitance increases with the height of each interconnect.

As the frequency of a signal increases, the signal is increasingly susceptible to RC delays. An RC delay (the value of time constant τ is a measure of the time needed to charge a capacitor through a resistor:

$$\tau = R \cdot C \quad (5)$$

The RC delay can then be expressed as generally proportional to square of the length and inversely proportional to the width and distance between the interconnects:

$$\tau \approx \frac{\ell}{h \cdot w} \cdot \frac{h \cdot \ell}{d} = \frac{\ell^2}{w \cdot d} \quad (6)$$

The typical digital propagation delay of a resistive wire is about half of R times C; since both R and C are proportional to wire length, the delay scales as the square of wire length.

Turning now to interconnects 109-112 and interconnects 113-114, the cross-sectional area of each of interconnects 109-112 is 2h*2w=4hw, while the aspect ratio is 2h/2w=h/w, namely, the same for interconnects 101-108. The cross-sectional area of each of interconnects 113-114 is 4h*4w=16hw, while the aspect ratio is 4h/4w=h/w, namely, the same for interconnects 101-108 and interconnects 109-112.

The RC delay for interconnects 109-112 can be approximated to be ¼ of the RC delay of the interconnects 101-108 as τ≈1/(2w2d)=¼wd. The RC delay for interconnects 113-114 can be approximated to be ¹⁄₁₆ of the RC delay of interconnects 101-108 as τ≈1/(4w4d)=¹⁄₁₆wd.

From the above calculation of the RC delay, it would appear that increasing the size and spacing of interconnects is enough to limit RC delays. However, this approach fails as the frequency of a signal increases. As the frequency of a signal increases, the skin effect begins to appear. The skin effect is the tendency of an alternating current signal to distribute itself within a conductor so that the current density near the surface is greater than at its core. The effective resistance increases with the frequency of the current. The skin effect is small at low frequencies (for instance, below 5 GHz) for interconnects on integrated circuits. However, as the signal increases, the skin effect also increases. Aspects of the invention may be applied to semiconductor devices (and their associated circuitry) that work with high frequency signals equal to and greater than 5 GHz or with semiconductor devices in which interconnects are susceptible to the skin effect as frequencies increase. The ramifications of the skin effect become more pronounced as the length of the interconnect increases (due in part to the increase in effective capacitance between interconnects due to the increased surface area between interconnects). In this regard, longer interconnects (for instance, those at a higher level in the semiconductor device) that carry high frequency signals may benefit from one or more aspects of the invention.

For instance, at microwave frequencies, most of the current in a good conductor flows in a thin region near the surface of the conductor. For comparison, a 10 GHz microwave frequency is approximately four times higher than the frequency used common devices including Bluetooth, wireless access points, microwave ovens, and satellite television (which operate around the 2.4 GHz band). These devices have approximately two times as much penetration into the surface of a conductor compared to the penetration of signals at frequencies around 10 GHz.

Figure 2:
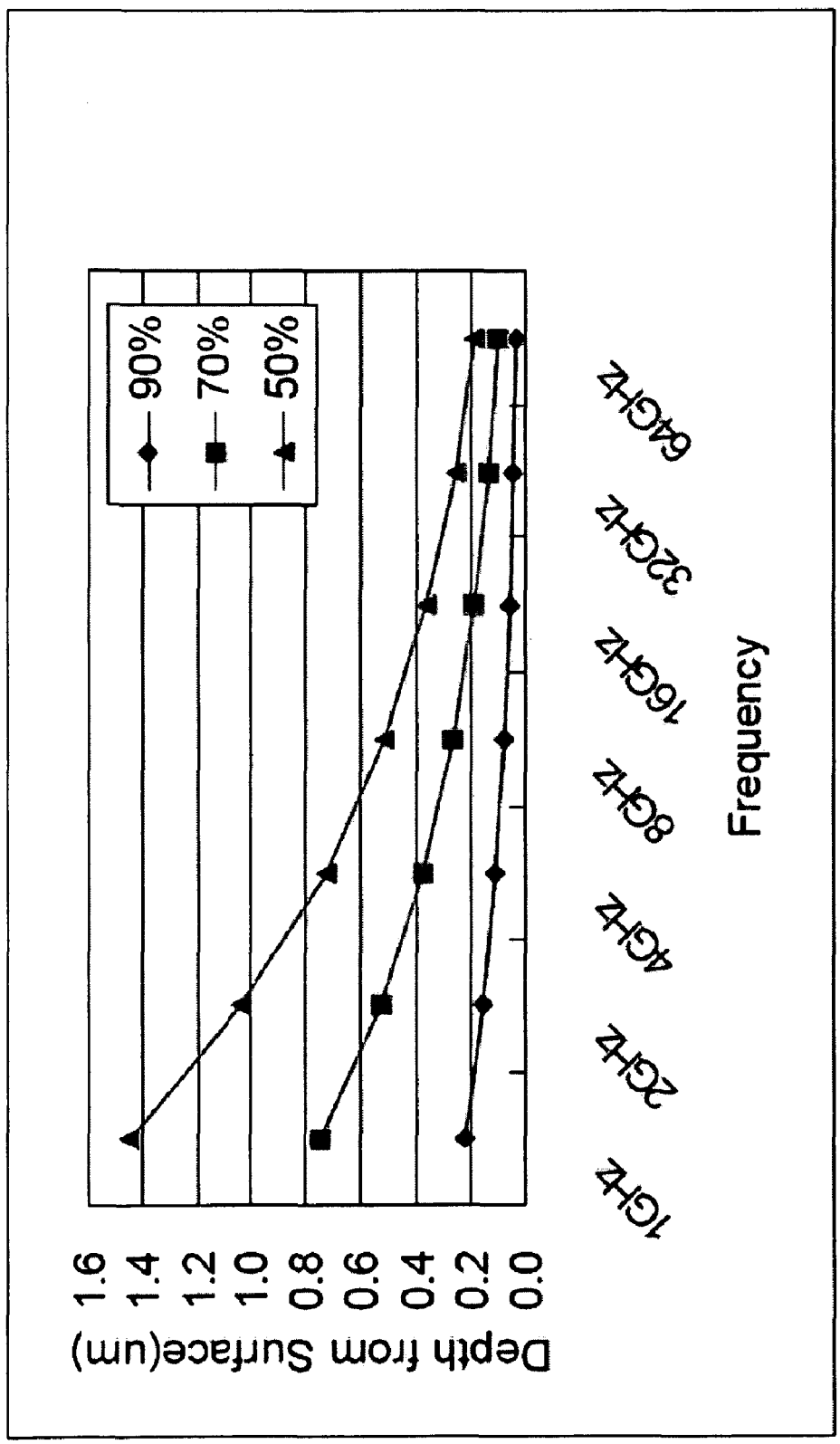
FIG. 2 shows a relationship between frequency and skin depth.

FIG. 2 shows a general calculation of the skin depth as frequency increases for conductors. The frequency range from 1 GHz to 64 GHz is shown on the x-axis and the depth from the surface of a conductor is shown on the y-axis in the range from 0.0 to 1.6 μm. FIG. 2 shows three curves, at 90%, 70%, and 50% of the current density into the conductor as frequency increases. Notably, for example, the 50% current density value drops from approximately 1.4 at 1 GHz to 0.5 at 8 GHz. The effect is that larger conductors as shown in FIG. 1 have less of an effect at higher frequencies of reducing resistance than at lower frequencies. In this regard, RC delays at higher frequencies are more significant than at lower frequencies.

High speed circuits benefit from interconnects with low resistive capacitive (RC) delays. Conventional interconnect structures as shown in FIG. 1 keep aspect ratios (height/width) of minimum width interconnects almost constant regardless of the interconnection level. The result is that the larger interconnects (109-112 and 113-114) are less efficient at conveying a high frequency signal than their larger size would suggest.

Figure 3:
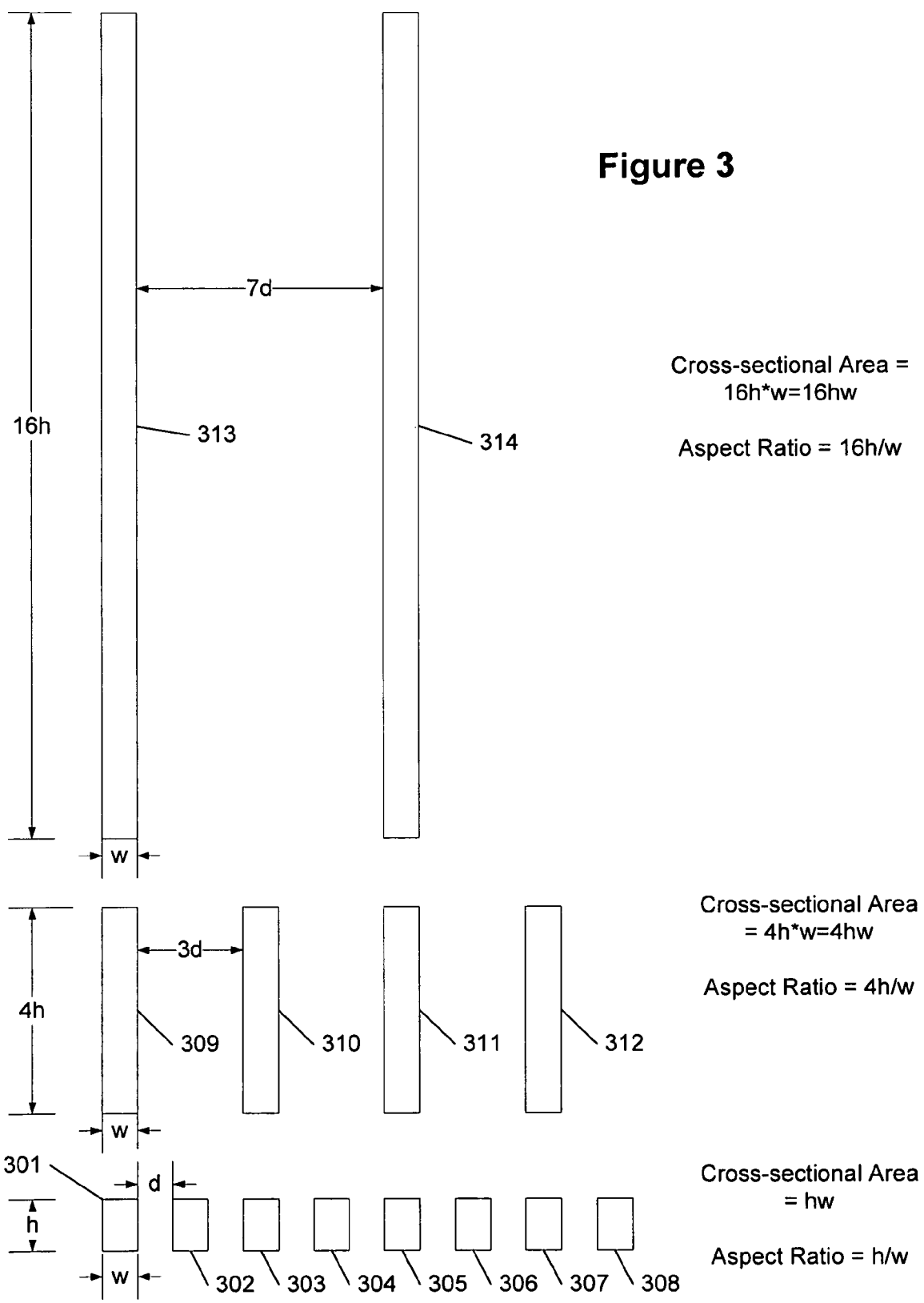
FIG. 3 shows an example of conductors with different cross-sectional areas and the same aspect ratio in accordance with one or more embodiments.

FIG. 3 shows various interconnects in an elevation view in accordance with one or more aspects of the invention. FIG. 3 includes interconnects 301-308 with a height h, a width w, and separated by distance d from each other. The cross-sectional area of each is hw and the aspect ratio is h/w. Interconnects 301-308 are similar to interconnects 101-108 of FIG. 1. It is appreciated that insulators (for example, silicon dioxide and other known insulators commonly positioned between interconnects) are positioned between adjacent interconnects.

FIG. 3 also shows interconnects 309-312 with a height of 4h and a width of w. For purpose of explanation, the distance between interconnects 309-312 is shown to be three times the distance d (namely, 3d). The cross-sectional area of each of interconnects 309-312 is 4hw and their aspect ratio is 4h/w. Here, the cross-sectional area (at 4hw) is the same as the cross-sectional area of interconnects 109-112. However, the aspect ratio is twice that of interconnects 109-112. In that skin depth decreases as frequencies increase, the effective resistance of interconnects 309-312 can be lower based on a greater surface area of interconnects 309-312. Because of the cross-sectional volume of interconnects 309-312 is added to the height, the effective distance between interconnects 309-312 is increased. In the example of FIG. 3, the distance is increased from 2d to 3d. The effect of increasing the distance between the interconnects while keeping the width to w (instead of increasing the width to 2w as shown in FIG. 1) changes the RC delay. It is believed that the RC delay would be less for the taller interconnects as the separation distance between them increase. Similarly, the RC delay is expected to be less for interconnects 313-314 than for interconnects 113-114 because of the increase in distance between the interconnects despite their increase in height. The difference is that the skin effect (by limiting the effective cross-sectional area of the interconnect at high frequencies) increases the effective resistance of the interconnect. By increasing the distance between the interconnects, the RC delay caused by the proximity of the interconnects is reduced.

In FIG. 3, the aspect ratio of the interconnects increases at higher metallization layers. For instance, standard chips have four or more metal layers. In one aspect of the invention, the increase in aspect ratio only occurs in the upper metal layers. Because of the extra materials required to make the higher aspect ratio interconnects, increase in height, the increased aspect ratio for interconnects is reserved in this instance to the upper level or upper levels of interconnects.

Another aspect of the invention shown in FIG. 3 is that the conventional approach of separating interconnects by a distance equal to their width is not followed. As shown in FIG. 3, the upper layer interconnects are separated by distances larger than their widths. For instance, interconnects 309-312 are separated by distances three times their width. Interconnects 313 and 314 are separated by distances seven times their width. In examples of FIG. 3, the increase in separation distance was due to attempting to not modify the general placement of the upper level interconnects. It is appreciated that other distances between interconnects may be used based on considerations of the aspect ratio, the dielectric material between the interconnects, the height (or effective height or surface area) of the interconnects, and the frequency or frequencies of the signals passing through the interconnects. For instance in addition to the above distances, the separation distance may be two times the width of the interconnect, four times the width of the interconnect, five times the width of the interconnect, six times the width of the interconnect, eight times the width of the interconnect, nine times the width of the interconnect, and the like.

Yet another aspect of the invention shown in FIG. 3 is the pitch used to create the higher aspect ratio for the upper level interconnects is larger than the minimum pitch of other lower level interconnects.

In one embodiment of the invention, the increase in aspect ratios may start in all the metal layers. In an alternative embodiment of the invention, the increase in aspect ratios may start at the fifth or higher metal layer.

One benefit by using the interconnect structure herein is that the device can be fabricated by conventional copper interconnect process and device technology.

In another aspect of the invention, the aspect ratio changes between the lower interconnect lines and the upper interconnect lines. In contrast, conventional metal interconnect structure of high performance logic LSI have larger minimum dimensions (wire width and height) in upper level with almost consistent interconnect aspect ratio (height/width) at the lowest level. This is because upper level interconnects are used for long distance signal propagation and need to be reduced RC delay. On the other hand and as described above, high frequency signals propagate only nearby surface of interconnect. Even though upper level interconnects have larger minimum dimensions with consistent aspect ratio and the larger intersectional area, the benefit of resistance reduction is smaller than increase of intersectional area. This tendency becomes more significant in larger dimension interconnects and higher frequency signals situations.

As used in one or more aspects of the present disclosure, higher aspect ratio in upper interconnects help to minimize impact of the skin effect. Here, the coupling capacitance increase can be prevented even if taller interconnects provide larger facing areas to adjacent interconnects by reducing the interconnect width and increasing the distance to adjacent interconnects.

FIGS. 4A-4D show various interconnects in an elevation view. In FIG. 4A, a single interconnect 401 is shown. The aspect ratio of an increased aspect ratio interconnect may be between 3.0:1 and the upper limit of what a formation process may support. For instance, conventional semiconductor formation processes can support an aspect ratio of 10:1 (albeit with difficulty). The conventional processes include forming a metal layer then etching away unwanted portions, resulting in high aspect ratio interconnects. Also, conventional processes include forming a trench and filling it with a metal. In this latter example, filling all trenches in a single operation can be difficult due in part to incomplete filling of a portion of a trench. Better results may occur through filling a single trench at a time. However, separately exposing, filling, etching, then masking each trench can be time-consuming and costly.

To accommodate greater aspect ratios (for instance, aspect ratios greater than 3:1), FIGS. 4B and 4C show interconnects connected by plugs to form interconnects with higher aspect ratios. FIG. 4B shows a first interconnect 402, a conductive plug 403, and another interconnect 404 electrically connected to the first interconnect 402 via the conductive plug 403. FIG. 4C shows a first interconnect 405, a first conductive plug 406, a second interconnect 407, a second conductive plug 408, and a third interconnect 409. The result is high aspect ratio interconnect.

FIG. 4D shows an interconnect made of a number of smaller interconnects and conductive plugs. FIG. 4D shows a first interconnect 410, a first conductive plug 411, a low aspect ratio interconnect 412, electrically connected to interconnect 410 by conductive plug 411, conductive plugs 414 and 415 on opposite ends of the top surface of interconnect 412, interconnect 416 connected to low aspect ratio interconnect 412 via conductive plug 414, and interconnect 417 connected to low aspect ratio interconnect 412 via conductive plug 415.

An advantage of the composite interconnect of FIG. 4D is its large surface area compared to its height. Further additional surface area advantages may be achieved through additional connections of smaller sets of interconnects in various geometric shapes (for instance, the "Y" shape of FIG. 4D, a "T" shape, stacked horizontal plates, and the like).

Figure 5:
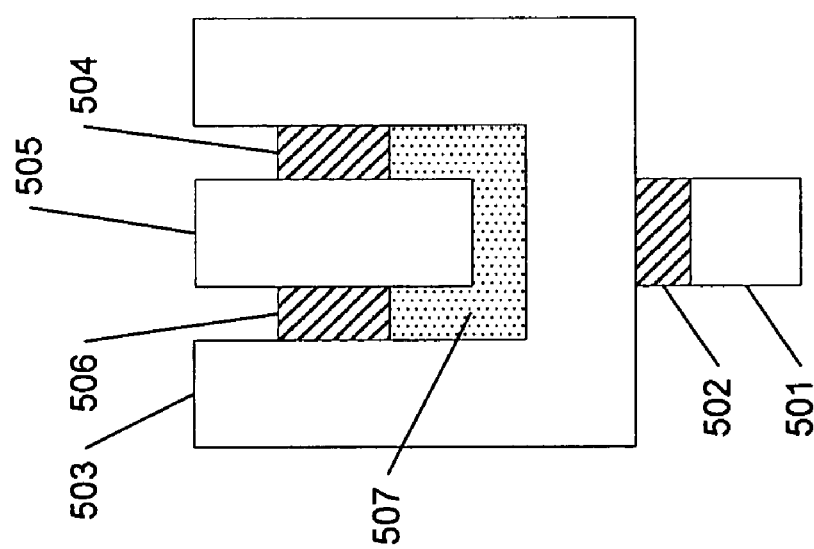
FIG. 5 shows another interconnect structure in accordance with another embodiment.

FIG. 5 shows yet another technique of increasing the surface area of an interconnect. Here, a lower interconnect 501 is connected to conductive plug 502. A "U" shaped interconnect 503 is connected to interconnect 501 through conductive plug 502. Interconnect 503 is then connected to another interconnect 505 through conductive plugs 504 and 506. It is appreciated that only one of conductive plugs 504 and 506 may be used. However in this example, both conductive plugs are used to permit more of the surface area of interconnect 503 to be used because of the skin effect as compared to a sole conductive plug (504, for example). An insulator 507 may partially (or completely) fill the inside of interconnect 503.

Figure 6:
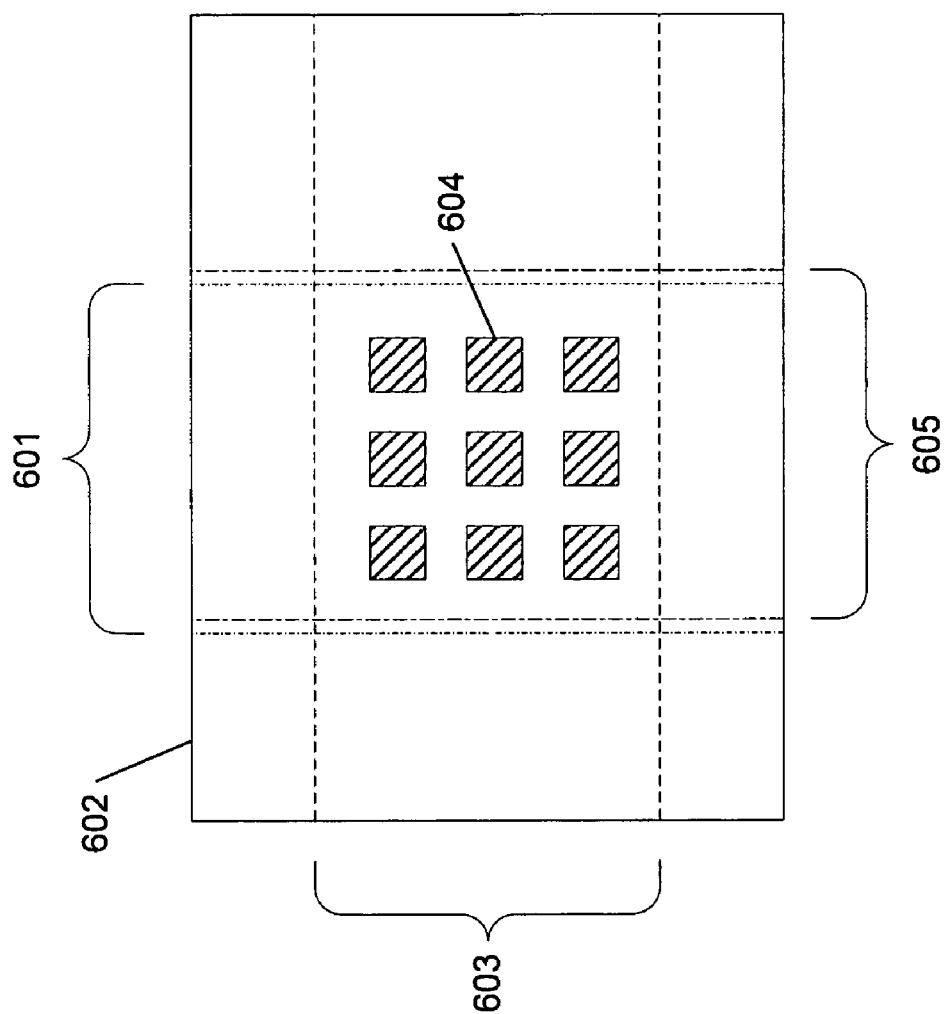
FIG. 6 shows examples of how multiple conductive plugs may be used to connect interconnects in accordance with one or more aspects of the invention.

FIG. 6 shows examples of how multiple conductive plugs may be used to connect interconnects in accordance with one or more aspects of the invention.

FIG. 6 shows a top-down view of an interconnect structure. A first interconnect 601 is arranged in a first direction, running from the top to the bottom of the Figure. An insulator 602 is shown on top of interconnect 601. Insulator 602 may silicon dioxide or any other insulator as known in the art. Interconnect 603 is arranged on top of insulator 602 from the left to right of the Figure. Conductive plugs 604 are shown connecting interconnects 601 and 603. Here multiple conductive plugs are used to decrease any resistance caused by the conductive plugs 604 in an electrical path from interconnect 601 to interconnect 603.

In another example, the upper-level interconnect 603 is replaced by interconnect 605. Interconnect 605 is arranged parallel to interconnect 601. Because of the longer parallel length between interconnect 601 and interconnect 605, additional conductive plugs 604 may be used to further connect interconnect 601 and interconnect 605. This will help further reduce any resistance between interconnect 601 and interconnect 605.

This specification describes the interconnects as metal lines (including for instance copper). In an alternative embodiment, the interconnects may be metallized lines and not purely metal.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. Numerous other embodiments, modifications, and variations within the scope and spirit of the appended claims will occur to persons of ordinary skill in the art from a review of this disclosure.

What is claimed is:

1. A semiconductor device comprising:
   a first interconnect at a first level with a first aspect ratio;
   a second interconnect at a second level with a second aspect ratio; where the second level is higher in the semiconductor device than the first level;
   one or more conductive plugs configured to electrically connect the first interconnect and the second interconnect,
   wherein the second aspect ratio is greater than 3.0:1 and the first aspect ratio is less than the second aspect ratio.

2. The semiconductor device according to claim 1, wherein the first aspect ratio is less than 2.0:1.

3. The semiconductor device according to claim 1, wherein the second level and the first level are separated by at least three additional levels of interconnects.

4. The semiconductor device according to claim 1, wherein the semiconductor device is a high frequency semiconductor device configured such that interconnects are adapted to convey signals equal to and greater than 5 GHz.

5. The semiconductor device according to claim 1, wherein the second interconnect includes at least two interconnects connected by conductive plugs.

6. The semiconductor device according to claim 1, wherein the second interconnect includes a concave portion at least partially filled with an insulator.

7. The semiconductor device according to claim 1, wherein the second interconnection layer is a metal line.

8. The semiconductor device according to claim 1, wherein the second interconnection layer is used for long distance signal propagation.

* * * * *